(12) United States Patent
Pierret et al.

(10) Patent No.: US 6,737,834 B2
(45) Date of Patent: May 18, 2004

(54) ENGINE CONTROL APPARATUS WITH AN ALTERNATOR REGULATOR CIRCUIT INTERFACE MEANS, AND A CORRESPONDING INTERFACE

(75) Inventors: Jean-Marie Pierret, Paris (FR); Damien Pensec, Nantes (FR)

(73) Assignee: Valeo Equipements Electriques Moteur, Creteil (FR)

( * ) Notice: Subject to any disclaimer, the term of this patent is extended or adjusted under 35 U.S.C. 154(b) by 0 days.

(21) Appl. No.: 09/925,980

(22) Filed: Aug. 10, 2001

(65) Prior Publication Data

US 2002/0047692 A1 Apr. 25, 2002

(30) Foreign Application Priority Data

Aug. 11, 2000 (FR) ........................................... 00 101575

(51) Int. Cl.[7] .......................... H02H 7/06; H02P 11/00; H02P 9/00
(52) U.S. Cl. ............................. 322/28; 322/24; 322/23; 322/22; 322/17
(58) Field of Search .............................. 322/28, 22–24, 322/17

(56) References Cited

U.S. PATENT DOCUMENTS

| | | | | |
|---|---|---|---|---|
| 3,882,371 A | * | 5/1975 | Shimer et al. ................. 321/61 |
| 3,924,195 A | * | 12/1975 | Matouka ....................... 328/181 |
| 4,020,802 A | * | 5/1977 | Hattori et al. ............ 123/32 EA |
| 4,121,554 A | * | 10/1978 | Sueishi et al. ......... 123/119 EC |
| 4,127,091 A | * | 11/1978 | Leichle .................... 123/117 D |
| 4,130,095 A | * | 12/1978 | Bowler et al. ........... 123/32 EE |
| 4,163,282 A | * | 7/1979 | Yamada et al. .............. 364/431 |
| 4,255,789 A | * | 3/1981 | Hartford et al. ............. 364/431 |
| 4,337,513 A | * | 6/1982 | Furuhashi ............... 364/431.11 |
| 4,656,403 A | * | 4/1987 | Treffer ....................... 318/341 |
| 4,879,501 A | * | 11/1989 | Haner ......................... 318/645 |
| 5,006,781 A | * | 4/1991 | Schultz et al. ................. 322/25 |
| 5,663,626 A | * | 9/1997 | D'Angelo et al. ........... 318/799 |
| 5,731,688 A | * | 3/1998 | Thomson ...................... 322/22 |
| 5,929,619 A | | 7/1999 | Chin et al. ................... 323/283 |
| 6,140,777 A | * | 10/2000 | Wang et al. ................. 315/247 |
| 6,188,203 B1 | * | 2/2001 | Rice et al. ..................... 322/25 |
| 6,392,372 B1 | * | 5/2002 | Mays, II ...................... 318/254 |
| 6,457,467 B1 | * | 10/2002 | O'Neill et al. ............... 123/683 |
| 6,496,340 B1 | * | 12/2002 | Hornberger et al. ........... 361/51 |
| 6,534,958 B1 | * | 3/2003 | Graber et al. .................. 322/11 |
| 6,560,528 B1 | * | 5/2003 | Gitlin et al. ................. 701/115 |
| 6,570,779 B2 | * | 5/2003 | Shimazaki et al. ............ 363/41 |

FOREIGN PATENT DOCUMENTS

DE 3934215 4/1991

OTHER PUBLICATIONS

English Abstract of DE 39 34 215.

* cited by examiner

Primary Examiner—Burton S. Mullins
Assistant Examiner—Pedro J. Cuevas
(74) Attorney, Agent, or Firm—Liniak, Berenato & White

(57) ABSTRACT

A motor vehicle alternator includes a regulator for varying excitation as a function of a reference variable, together with a conversion circuit for varying the reference variable (such as a voltage) according to a PWM signal. It includes, in combination: an internal clock with a controlled variable period; a difference circuit which produces a difference signal between the period of the PWM signal and that of a signal from the clock; a control circuit which governs the internal clock in response to the difference signal in such a way as to equalize the periods of the internal clock signal and the PWM signal; and a conversion circuit which comprises a counter paced by the clock and active while the PWM signal is at a given logic level, together with a D/A converter for converting the count from the counter into a voltage from which the regulator reference voltage is obtained.

20 Claims, 7 Drawing Sheets

Fig. 1
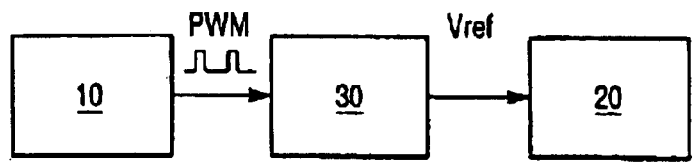
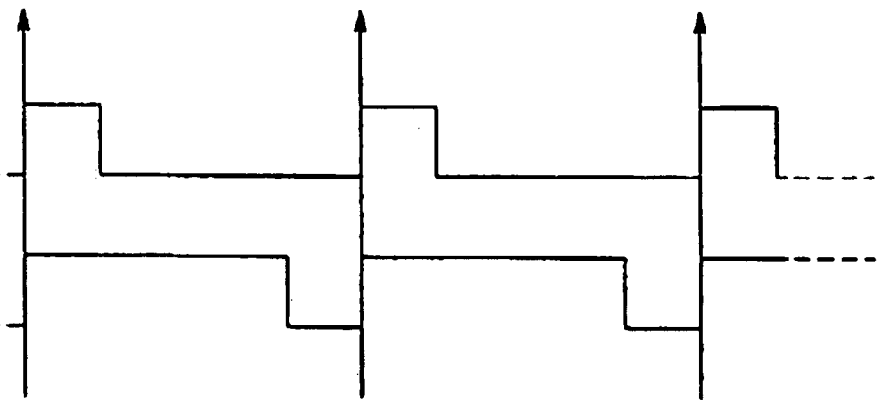
Fig. 2a ----
Fig. 2b ----
Fig. 3
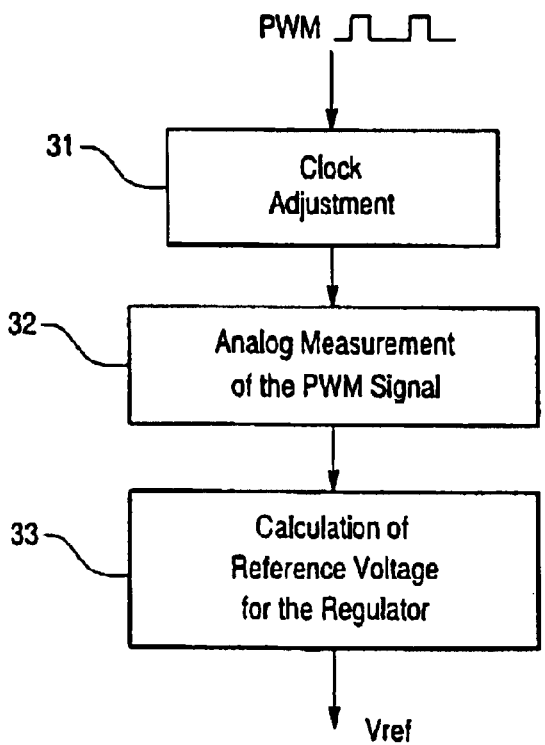

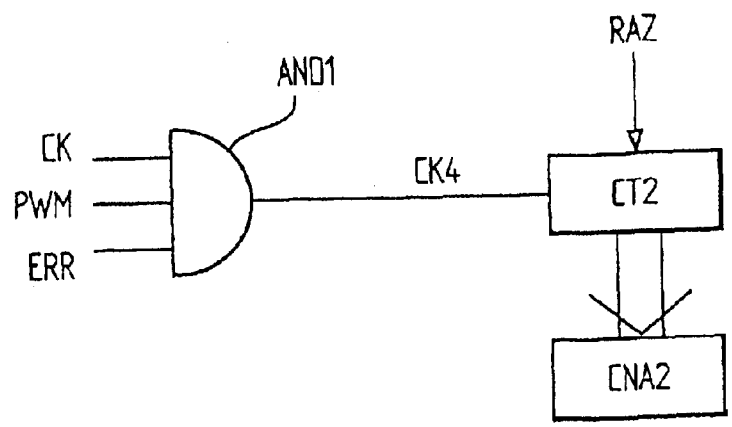
FIG.8
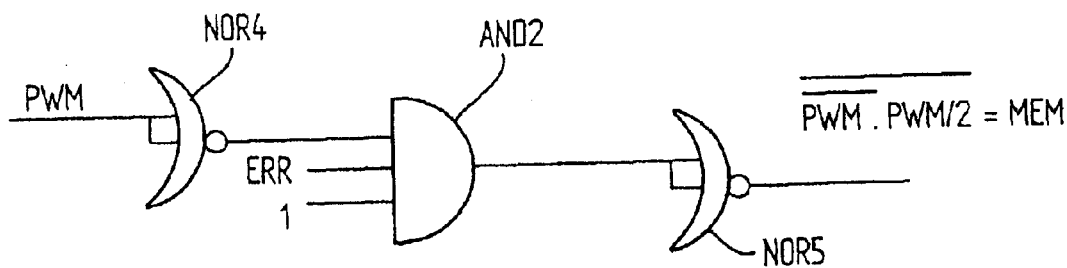
FIG.9
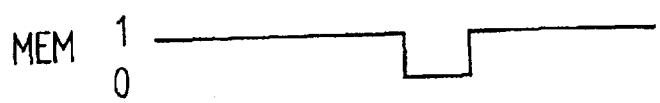
FIG.10

ENGINE CONTROL APPARATUS WITH AN ALTERNATOR REGULATOR CIRCUIT INTERFACE MEANS, AND A CORRESPONDING INTERFACE

FIELD OF THE INVENTION

The present invention relates in general terms to alternators or starter alternators for motor vehicles, and in particular to the regulation of such alternators.

BACKGROUND OF THE INVENTION

The regulation of the output voltage of an alternator is conventionally performed by comparing a signal taken at the output of the alternator with a reference voltage. In the simplest regulators, this reference voltage is fixed. In more sophisticated systems, the reference voltage may be made to vary according to the environment of the alternator (in terms of factors such as temperature, magnitude of the electrical load supplied at a given instant, and so on).

The most modern alternators offer the possibility of modifying the regulation reference voltage by communication of data with a remote intelligent device, such as a central control unit of the vehicle which is dedicated to the control of various components, such as the engine control apparatus or the remote control of various electrical loads, for instance.

One known solution for indicating to an alternator regulator circuit the reference voltage which it must adopt consists in making use of a pulse width modulated signal, also referred to in this specification as a PWM signal, in which the width of the pulses determines the value that the reference voltage must assume. Conventionally, the PWM signal received is applied to an integrator circuit of greater or less sophistication, which delivers an output signal consisting either of the reference voltage itself, or a voltage which enables the required correction to be made to a basic reference voltage. Such an approach is relevant in that it enables variations in the period of the received PWM signal to be cancelled out, so that only the cyclic ratio of this signal is taken into account.

One difficulty with this known conversion technique lies in the fact that, in order to perform the integration, it is necessary to have relatively high values of capacity (which are typically of the order of one or more tens of nanofarads), which prevents incorporation of the whole of the integrator circuit actually within an integrated circuit such as that on which the regulator is implemented. Thus, as a minimum, such a regulator makes it necessary to have one or more discrete capacitances connected to specific terminals of the integrated circuit.

DISCUSSION OF THE INVENTION

The present invention aims to overcome the above limitations of the current state of the art, and to propose a signal for conversion of a received PWM signal which can be made entirely in integrated technology, while eliminating problems of variation of period in the PWM signal, and at the same time being capable in all cases of delivering with precision the voltage represented by the PWM signal.

According to a first aspect of the invention, an alternator for a motor vehicle, comprising a rotor and a stator and a regulator circuit for varying the excitation of the alternator by comparison of a signal representing the output voltage of the alternator with a variable reference voltage, and a conversion circuit provided to vary the reference voltage as a function of a reference control signal in the form of a pulse width modulated signal, is characterized in that the conversion circuit comprises, in combination:

an internal clock with a controllable variable period;
a differential circuit provided to establish a difference signal between the period of the reference control signal and the period of a signal from the internal clock;
a control circuit for the internal clock, adapted to control the internal clock in response to the difference signal in such a way as to equalize the period of the internal clock signal and the period of the control signal; and
a circuit for converting pulse width into voltage, comprising a counter which is paced by the controllable internal clock and which is adapted to perform a counting operation so long as the reference control signal is at a given logic level, and a digital/analogue converter which is adapted to convert a value of the count supplied by the counter into a voltage from which the reference voltage of the regulator is obtained.

According to the invention in a second aspect, an interface device for constituting the interface between a control apparatus which supplies a reference control signal in the form of a pulse width modulated signal, and a regulating device for a motor vehicle alternator, wherein the variations in width of the pulses in the signal are arranged to be converted into variations in a reference voltage of the regulating device, is characterized in that it comprises, in combination:

an internal clock with a controllable variable period;
a differential circuit adapted to establish a difference signal between the period of the reference control signal and the period of a signal from the internal clock;
a control circuit for the internal clock, adapted to control the internal clock in response to the difference signal in such a way as to equalize the period of the internal clock signal and the period of the control signal; and
a circuit for converting pulse width into voltage, comprising a counter which is paced by the controllable internal clock and which is adapted to perform a counting operation so long as the reference control signal is at a given logic level, and a digital/analogue converter which is adapted to convert a value of the count supplied by the said counter into a voltage from which the reference voltage of the regulator is obtained.

Some preferred, but not limiting, features of the alternator and of the interface device according to the invention, which may be adopted alone or in any technically feasible combination, are set forth below.

The difference circuit may comprise means for producing a symmetrical rectangular signal, the period of which is a whole number multiple of the period of the reference control signal.

The difference circuit may comprise a means for producing pulses representing the difference between the symmetrical rectangular signal and a signal produced from the internal clock.

The width of the difference pulses may be proportional to the difference between the period of the reference control signal and the period of the signal from the internal clock.

The difference circuit may include a means for producing a signal representing difference in direction, at least during the duration of the difference pulses.

The control circuit for the internal clock may comprise a bidirectional counter adapted to receive the difference pulses and the direction difference signal, together with a digital/analogue converter receiving the output from the bidirectional counter.

The internal clock may comprise a voltage controlled oscillator.

The digital/analogue converter of the conversion circuit may have a memorization input, while means may be provided for applying to the input a memorization signal during which the reference control signal is at a logic level other than the given logic level, each time that the counter has performed an acquisition of the value of the cyclic ratio of the reference control signal.

The conversion circuit/interface device may be made entirely in integrated technology.

The conversion circuit/interface device may be formed on a common semiconductor chip with the regulator circuit.

Further features and advantages of the invention will appear more clearly on a reading of the following detailed description of a preferred embodiment of the invention, and of some modified versions, all of which are given by way of non-limiting example only and with reference to the accompanying drawings.

BRIEF DESCRIPTION OF THE DRAWINGS

FIG. 1 is a simple block diagram of the context of the invention.

FIGS. 2a and 2b illustrate two PWM signals with different cyclic ratios, in the diagram of FIG. 1.

FIG. 3 illustrates the present invention in the form of an operation diagram.

FIGS. 8 and 9 show, respectively, two concrete embodiments of two further blocks in the diagram shown in FIG. 4, which enable the cyclic ratio of the reference control signal to be measured after the internal clock has been synchronized with the reference control signal.

FIG. 10 is a time diagram for signals at the level of a conversion stage in the circuit of the invention.

DESCRIPTION OF PREFERRED EMBODIMENTS OF THE INVENTION

Figure 4:
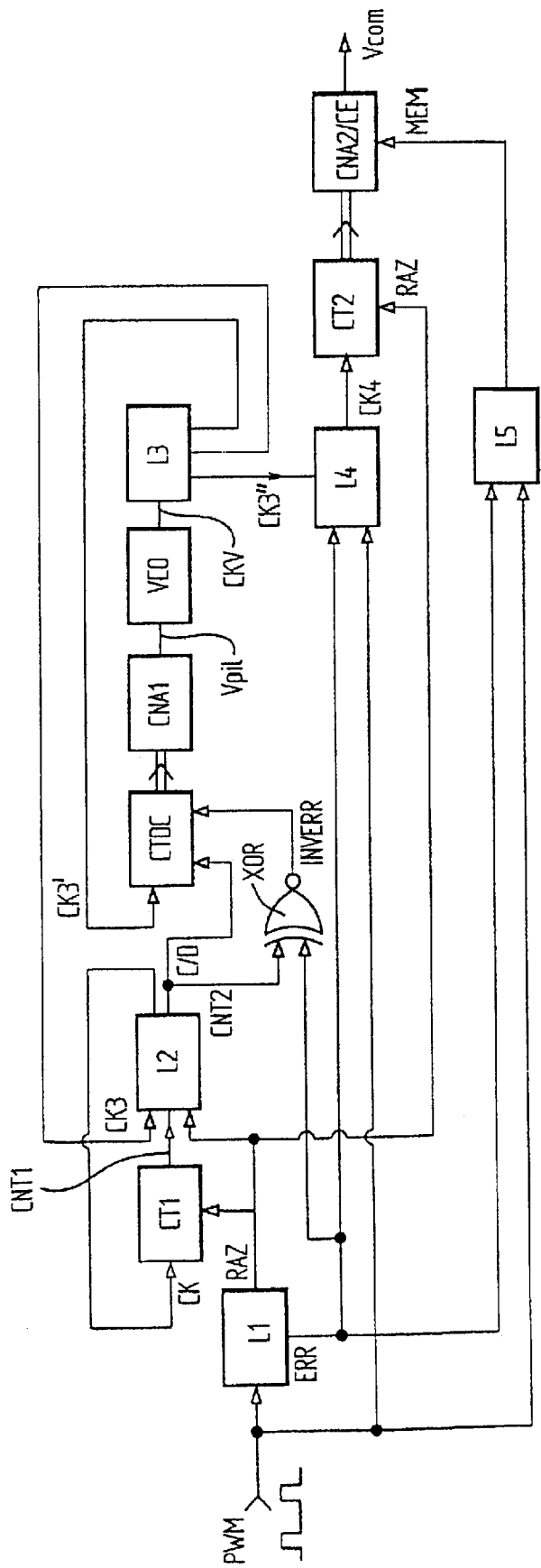
FIG. 4 is a logic diagram for an interface circuit in accordance with the invention.

Reference is first made to FIG. 1, which shows diagrammatically an electronic engine control apparatus 10 and a regulator circuit 20 for regulating the output voltage of an alternator or a starter-alternator. The apparatus 10 delivers a PWM signal, from which a reference voltage Vref for the regulator 20 can be obtained. This is achieved by means of a conversion circuit or interface 30, which converts the PWM signal, and more precisely its pulse width, into the above mentioned reference voltage.

With reference now to FIGS. 2a and 2b, these show two possible waveforms for the PWM signal, given that the width of its pulses can vary for example between 10% and 90% of the total period of the signal.

Referring now to FIG. 3, this is an operation diagram to show the operation of the conversion circuit 30, with a first function 31, in which the oscillation frequency of a clock in the conversion circuit or interface is adjusted, a second function 32, and a third function 33. The second function 32 measures the width of a pulse of the PWM signal by counting on the basis of a stepwise pacing signal supplied by the clock. The third function 33 establishes the effective value of the reference voltage Vref from the measurement carried out in the step 32.

Reference is now made to FIG. 4, which is a logic diagram showing the architecture of the conversion circuit or interface 30. It comprises a first logic circuit L1 which receives the PWM signal as an input, and which has an output that delivers a zeroing signal RAZ. The way in which this zeroing signal is used will be seen later herein. The same output also delivers an error signal ERR which will also be used in a manner to be described later.

The conversion circuit 30 also includes a first counter CT1 which is arranged to be zeroed by the signal RAZ, and which receives on a clock input a counting signal CK delivered by a second logic circuit L2. The logic circuit L2 receives the zeroing signal RAZ on one input, and on another input an output signal CNT1 from the counter CT1. On a third input, the circuit L2 receives a clock signal CK3 delivered by a further logic circuit L3. The logic circuit L2 passes the clock signal CK as an output signal together with a signal CM2, which at the same time constitutes a signal C/D representing the counting direction.

An exclusive OR gate XOR receives on a first input the signal CN2 delivered from the logic circuit L2, and on a second input, the error signal ERR from the logic circuit L1. The output signal from the OR gate XOR is an inverted error signal INVERR.

The circuit 30 further includes a bidirectional counter CTDC, having a counting direction input which receives the signal C/D from the logic circuit L2, and another input which receives the inverted error signal INVERR from the OR gate XOR. The bidirectional counter CTDC delivers as an output signal a count on several bits which is applied to the input of a digital/analogue converter CNA1. The analogue output voltage Vpil of the converter CNA1 controls an internal clock of the circuit, consisting of a voltage controlled oscillator VCO. This oscillator delivers a rectangular output signal CKV of variable frequency.

This output signal CKV is applied to the logic circuit L3, which is built around a counter. Bits in different rows are taken from the output of this counter so as to constitute a multiple output frequency divider. One of these outputs is a clock signal C3 which paces the bidirectional counter CTDC. Finally, a third output is a clock signal CK3" which is applied on one input of a fourth logic circuit L4, which also receives the signal ERR and the PWM signal on two respective further inputs. The output of the circuit L4 is a clock signal CK4 which paces a counter CT2, zeroing of which is controlled by the signal RAZ described above.

The multi-bit output of the counter CT2 is applied to a second digital/analogue converter CNA2, the output of which is an analogue voltage Vcorr, which is adapted to correct a fixed voltage also produced (in a manner known per se) in the regulator of the alternator, so as to obtain the variable reference voltage Vref. The converter CNA2 has an input MEM which enables the value available at the output of the counter CT2 to be taken and memorized. This input MEM is connected to the output of the logic circuit L5, one of the inputs of which is connected to the PWM input of the logic circuit L1, while another input is connected to the output ERR of the logic circuit L1.

Figure 5:
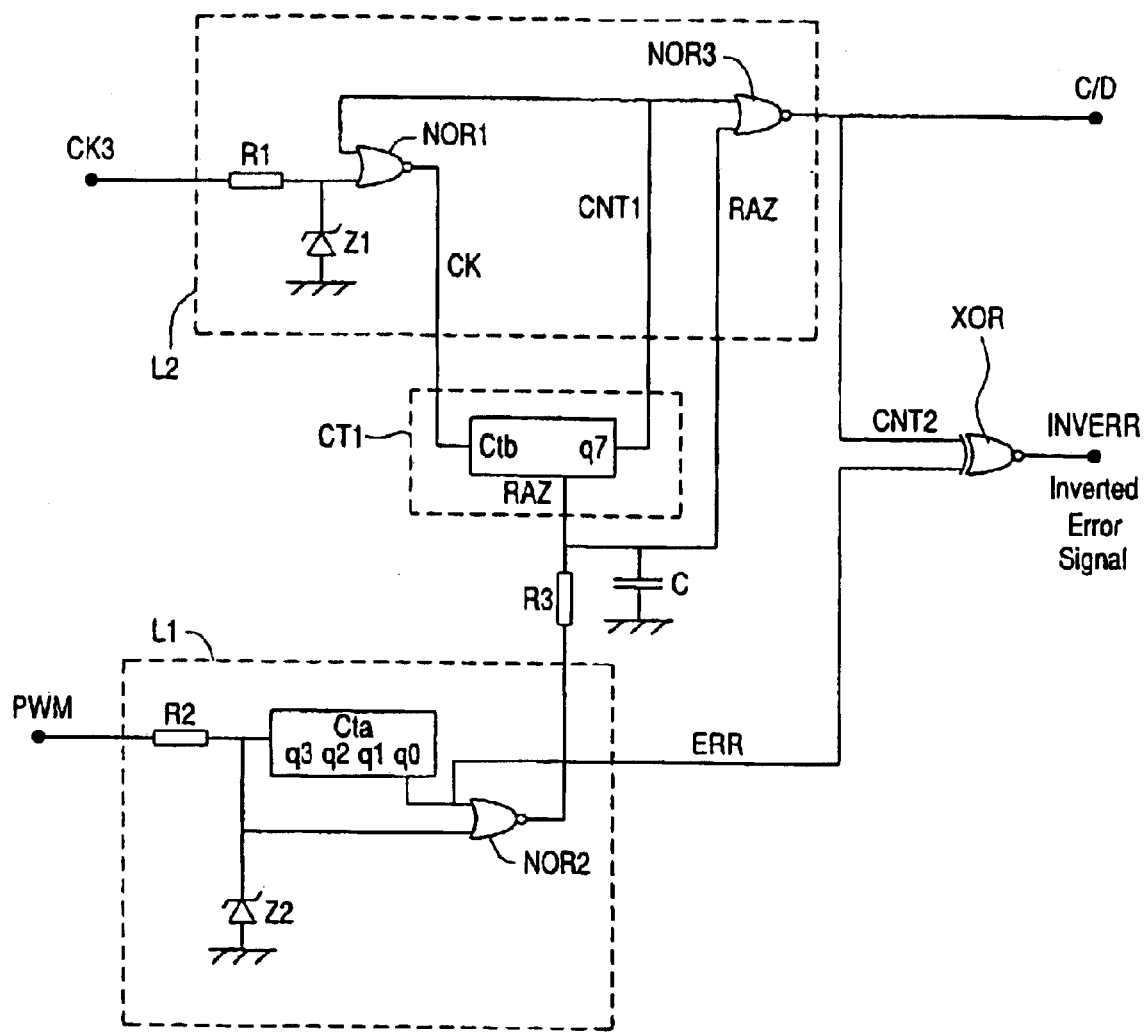
FIG. 5 shows one concrete embodiment of the blocks of FIG. 4 delivering difference pulses (or error signals) and signals representing the directions of the said error signals.

The operation of the circuit in FIG. 4 will now be described in detail with reference to FIG. 5 and to subsequent Figures which show the practical or concrete implementation of some of the circuits in FIG. 4, and the waveform or shape of certain signals.

The PWM signal transmitted by the engine control unit 10 to the interface 30 is applied to the logic circuit L1, which delivers from the PWM signal a signal RAZ which is used by the counter CT1 and the logic circuit L2. The circuit L2 delivers a signal CNT2 or C/D, with a duration proportional to the period of the signal CKV delivered by the internal clock VCO.

The signal CNT2 delivered by the logic circuit L2 is combined in the gate XOR with a signal ERR which is a symmetrical rectangular signal, the period of which is double that of the PWM signal, obtained by the logic circuit L1.

The gate XOR thus delivers an inverted error signal INVERR which converts an error in synchronization between the frequency of the signal CKV delivered by the clock VCO and the frequency of the reference control signal PWM. This inverted error signal INVERR is applied on the holding input of the bidirectional counter CTDC. This counter counts up or down according to the level of the signal C/D provided by the logic circuit L2, and it does this over the whole duration of the inverted error signal INVERR. The output of the counter CTDC is coded on 8 bits and is converted into an analogue signal by the converter CNA1. The analogue signal is applied to the input of the variable clock signal VCO, the oscillation frequency of which varies in such a way that it seeks to annul the error signal.

The counter CT1 is thereby enabled to perform a counting operation which is always identical during the period of the PWM signal, whatever values this period is able to take in a predetermined time interval.

The clock signal CK3 produced by the logic circuit L3 from the signal CKV provided by the oscillator VCO has a period equal to four times that of the signal CKV. This signal supplies the logic circuit L2.

The circuit L3 also delivers a signal CK3', which has a period equal to sixteen times the period of the signal CKV, and which controls the bidirectional counter CTDC.

The signal CK3" delivered by the logic circuit has a period equal to double that of the signal CKV, and is applied to a logic circuit L4 in which this signal is combined with the error signal ERR and with the PWM signal itself. A signal CK4 is obtained which paces the counter CT2. The latter produces a digital signal, for example on 8 bits, which is converted by the converter CNA2 into an analogue voltage.

It is desirable to provide an output circuit CNA2 with a continuous voltage, avoiding conversion of the output values from the counter CT2 during the counting and zeroing phases. The digital/analogue conversion has to be carried out when the counter CT2 has just measured the pulse width of the PWM signal representing the cyclic ratio of that signal. To this end, the circuit CNA2 is chosen to be of the type having a sampling input (or memorizing input) CE, which enables the output voltage to be blocked at the current value when the logic signal MEM on that input is at logic level 0. The logic circuit L5 is designed to produce the signal MEM from the PWM signal and the signal ERR, whereby to obtain a continuous output voltage of the converter CNA2.

The assembly consisting of the logic circuits L1 and L2 together with the counter CT1 and the logic gate XOR will now be described in detail with reference to FIG. 5. The purpose of this assembly is to obtain an error signal INVERR which represents the difference between the variable period Tpwm of the PWM signal supplied by the engine control unit, and the period of the internal clock VCO of the circuit.

This error signal INVERR will be used by the other circuits to obtain precise measurement of the period Tpwm. The PWM signal is applied to a counter Cta which is part of the logic circuit L1, through a protection circuit R2, Z2. The counter Cta is a 4-bit counter that delivers on its output q0 (the bit of lightest weight) the symmetrical error signal ERR, the period of which is equal to twice that of the PWM signal. This signal is combined with the PWM signal in a NOR gate NOR2 to produce the zeroing signal RAZ. The resistor R3 and the capacitor C eliminate any parasites in the signal RAZ.

The circuit L2 receives the clock signal CK3 supplied by the circuit L3 (see FIG. 4), through a protection circuit R1, Z1. This signal is applied on one input of a NOR gate NOR1 so as to be combined with the output from the counter CT1 which, in this example, consists of a counter Ctb, of 8 bits Cta, the output of which is taken on the heaviest bit q7. The output signal CK delivered by the gate NOR1 is applied to the pacing input of the counter CT1/Ctb. Thus, so long as the output bit q7 is at logic level 0, the counter CT1/Ctb will be incremented in sympathy with the signal CK, until either the bit q7 passes to logic level 1, or the signal RAZ becomes active.

Due to the fact that the period of the PWM signal and the period of the clock signal VCO are not synchronous (the period of the PWM signal being variable), this means that the counter CT1/Ctb will finish being incremented before or after the end of the period Tpwm of the PWM signal. It also means that such an offset represents the synchronizing error that exists. This error is revealed first by combining the signal on the output q7 of Ctb with the signal RAZ, in the NOR gate NOR3, and then by combining the output of this gate with the error signal ERR delivered by the counter Cta into the gate XOR, which delivers the required error signal INVERR.

Figure 6A:
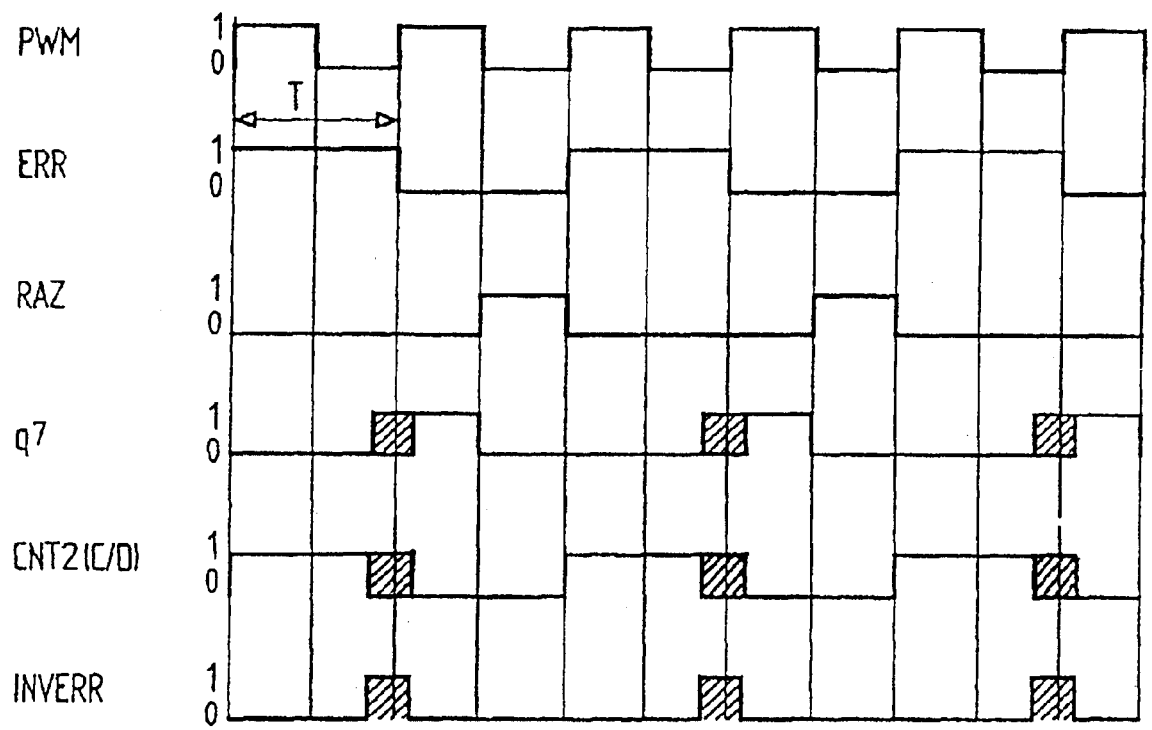
FIGS. 6a to 6c are time diagrams showing the shape of some of the signals found in the circuit shown in FIG. 5.
Figure 6B:
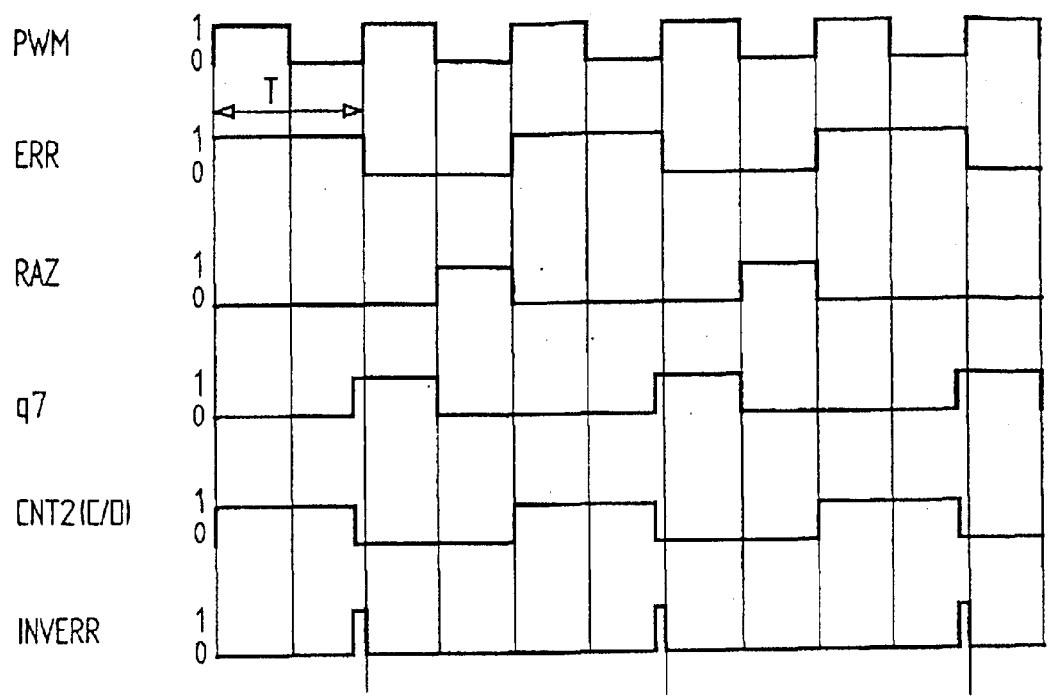
Figure 6C:
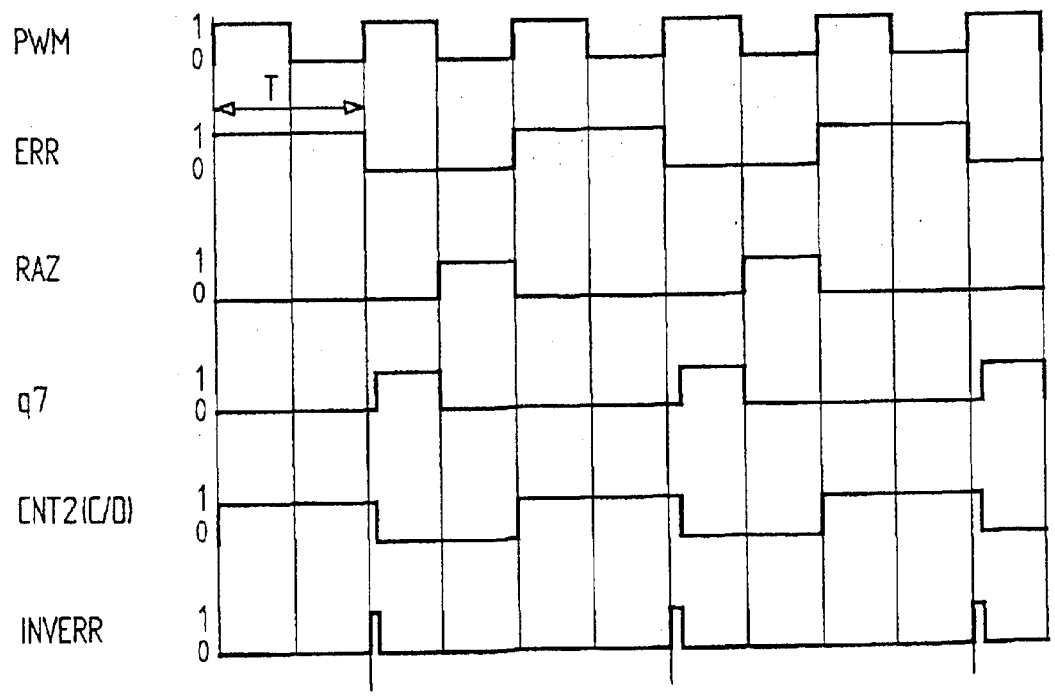

The waveforms of the signals mentioned in the foregoing description are shown in FIGS. 6a to 6c, to which reference is now made. FIG. 6a indicates, by hatched zones, the fields of variation of the signals q7, INVERR and C/D, while FIGS. 6b and 6c show respectively the case where the internal clock VCO is too rapid with respect to the period T, or, on the other hand, too slow with respect to that period.

When the error signal INVERR has been obtained, the circuit is adapted to modify the frequency of its internal clock (oscillator VCO), by acting on the control voltage Vpil in such a way as to cancel this error out. To this end, the bidirectional counter CTDC receives:

on its holding input (CARRY), the signal INVERR, in such a way that the operation of counting up or down takes place only when the signal INVERR is active (at high level); and on its counting direction input (U/D or "up/down"), the counting direction signal C/D mentioned above, which is identical to the signal CNT2, which determines when the counter must count up and when it is to count down.

The counter CTDC supplies a count on 8 bits supplied to the converter CNA1, which delivers an analogue voltage representing the value of the count, which constitutes the voltage Vpil governing the internal clock VCO.

In concrete terms, in the case of FIG. 6b in which the period of the internal clock is too short with respect to that of the PWM signal (and therefore its frequency is too high), it will be observed that the signal INVERR includes a short peak on each cycle, and that during this peak, the signal C/D is at logic level 0. In consequence, the count in the bidirectional counter CTDC will be decreased, in order thereby to reduce the voltage Vpil and therefore the frequency of the clock VCO. It will also be understood that this diminution is proportional to the error to be corrected (the width of the peaks INVERR).

Conversely, in the case of FIG. 6c, the frequency of the clock VCO is too slow with respect to that of the PWM signal. Thus the peaks are produced in the signal INVERR, and during these peaks the signal C/D is at logic level 1. As a result, the counter CTDC will augment its count, in order to increase the voltage Vpil and therefore the oscillation frequency of the circuit VCO.

Thus on each operating cycle, that is to say on both cycles of the PWM signal, the circuit tends to adjust the frequency of the internal clock to that of the PWM signal.

Figure 7:
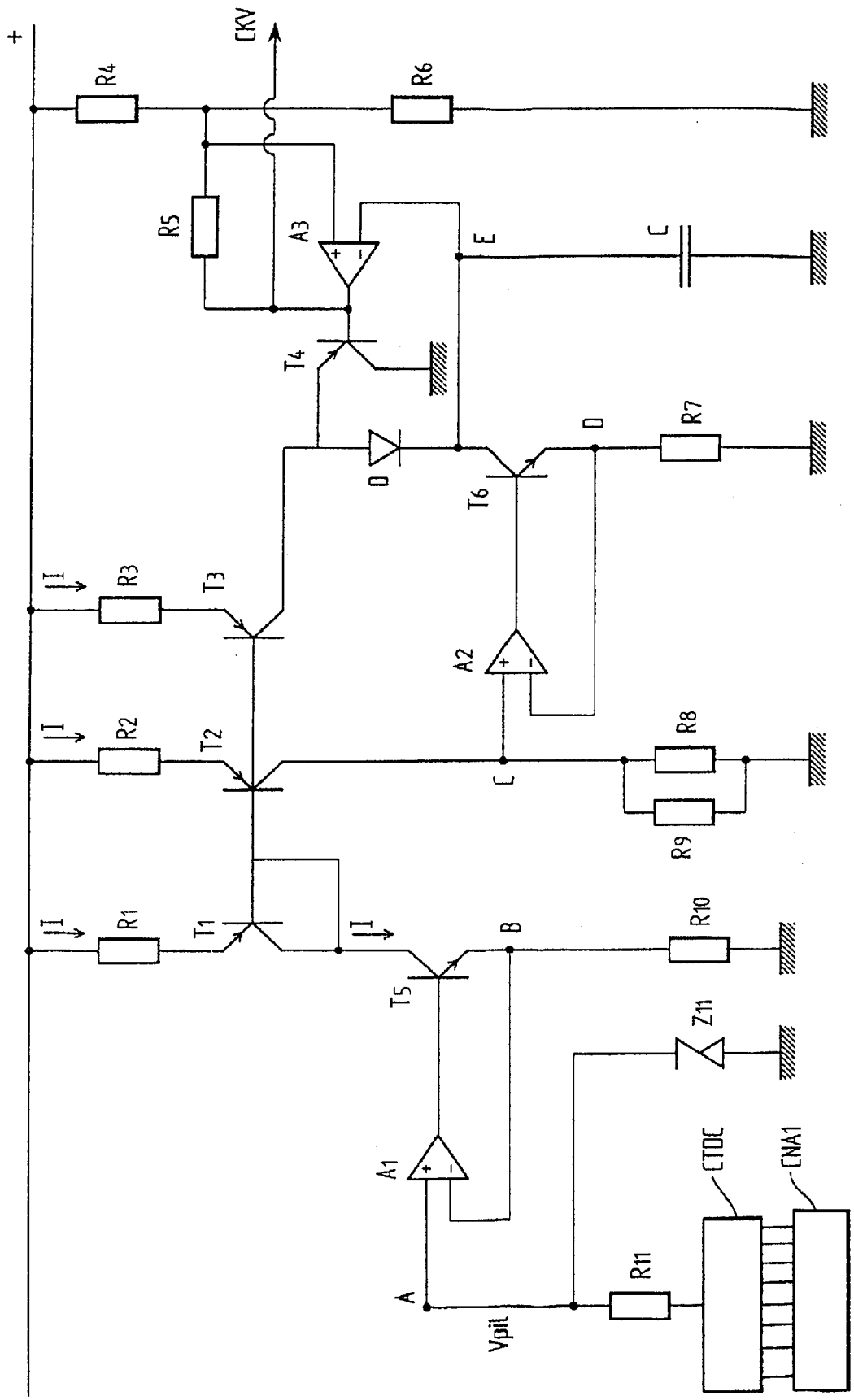
FIG. 7 shows one example of a concrete embodiment of a variable clock circuit used in the circuit shown in FIG. 4.

One example of implementation of the integrated technology of the circuit VCO is shown in FIG. 7, to which reference is now made. It comprises an operational amplifier A1 which reproduces the voltage present on its input A, which receives the control voltage Vpil, on the point B. The transistor T5 is a current source which produces a current I proportional to the voltage Vpil. This current is copied due to current reflectors constituted by the transistors T1, T2 and T3, with the values of the resistors R1, R2 and R3 being chosen to be identical with each other.

The operational amplifier A2 reproduces at a point D the voltage present at the point C, that is to say the voltage which is caused by the passage of the current I into the parallel circuit of the resistors R8 and R9.

The resistors R7, R8 and R9 all have the same value, and a current equal to I/2, produced by the transistor T6, therefore flows through the transistor R7. Initially, the capacitor C is discharged and the potential at the point E is zero. The negative input terminal of the operational amplifier A3 is therefore at zero potential. Given that its positive input terminal is connected to the positive potential (indicated at +) of the circuit, its output is at that potential and constitutes an upper threshold for the inversion of A3.

In this situation, the transistor T4 is polarized inversely and is therefore blocked, while the diode D is passing. The current I produced by T3 is therefore able to flow through the diode D, and accordingly there is a current I/2 in the transistor T6 and the resistor R7, and a current I/2 in the capacitor C.

The capacitor C therefore charges up, and when the inversion threshold of the operational amplifier A3 is reached, the output of the latter passes to zero potential with a low inversion threshold. The transistor T4 then becomes passing and the diode D, polarized inversely, becomes blocked. The current arising from the transistor T3 is then no longer able to pass through the diode D, and it flows through the transistor T4 which is connected to ground. The capacitor C then discharges via the current source constituted by the components T6, A2 and R7.

It will be understood that, according to the variations in the input voltage, the value of the current I varies, and the period of oscillation, determined by the successive switching operations of A3, also varies. The component A3 then delivers a symmetrical rectangular output signal CKV, the period of which varies with the level of the voltage Vpil.

It will be noted here that the assembly of the circuit VCO of FIG. 4 is easy to make in integrated technology. In particular, the capacitor C may have a very low value, being typically of the order of a few tens of picofarads.

The logic circuit L4 is shown in greater detail in FIG. 8, to which reference is now made. It consists of an AND gate AND1 with three inputs, which receive respectively the clock signal CK3" arising from the time division CKV by the circuit L3, the PWM signal and the error signal ERR. The output of the AND gate is applied on the counter CT2.

As to the logic circuit L5, this is shown in FIG. 9. It includes an AND gate AND2 with three inputs, in which a first input receives the signal/PWM which is obtained from the PWM signal through a NOR gate NOR4 connected as an inverter. A second input of the AND gate receives the error signal, and its third input receives a fixed signal at logic level 1. The output of the AND gate AND2 is applied to a NOR gate NOR5 connected as an inverter. The output MEM of this NOR gate is itself applied to the memory input /CE of the converter CNA2.

Reference is now made to FIG. 10, which will enable the operation of the measuring part of the cyclic ratio of the PWM signal to be well understood. During one cycle, the counter CT2 is incremented from zero during the duration of the pulse at level 1 of the PWM signal, and the value of the count VCT is shown in the upper part of FIG. 10, with a rising phase followed by a stable phase before reversion to zero. The signal MEM generated by the logic circuit L5 produces a memory pulse during the stable phase of the signal VCT, which enables a voltage Vcorr, rigorously proportional to the pulse width of the PWM signal, to be delivered at the output until the next following memory pulse occurs.

This voltage is combined with a fixed internal reference voltage of the regulator, for example by means of a conventional voltage adding circuit (which is not shown), in order to produce in the regulator the required variable regulating voltage Vref.

Because of the permanent adjustment of the internal clock VCO of the circuit over the period of the PWM signal, the counting rhythm of the pulses in the PWM signal, applied to the period of the latter, remains constant. The signal Vcorr is produced with great precision even where there are substantial variations in the period of the PWM signal.

One essential advantage of the circuitry described above is that it can be made entirely in integrated technology, in particular in terms of the absence of high capacitances. This circuitry can be implemented for example on the same semiconductor chip as the regulator itself.

The present invention is of course in no way limited to the embodiment described as a particular example above: a person skilled in this technical field would be able to apply to it numerous variations and modifications. In particular, as was mentioned in the introduction to this specification, the invention is applicable not only to alternators as such but also to alternators in the form of alternator-starters.

What is claimed is:

1. A motor vehicle alternator comprising: a stator; a rotor mounted in the stator; a regulator circuit connected in the alternator and defining a variable reference voltage, the regulator circuit being provided to vary the excitation of the alternator by comparing a signal representing the output voltage of the alternator with the reference voltage; and a conversion circuit connected with the regulator circuit and arranged to receive a pulse width modulated reference control signal, whereby the conversion circuit is provided to vary the variable reference voltage as a function of the reference control signal, wherein the conversion circuit comprises, in combination:

an internal clock with a controllable variable period;

a difference circuit connected to the internal clock for producing a difference signal between the period of the reference control signal and the period of a signal from the internal clock;

a control circuit for the internal clock, connected to the internal clock and the difference circuit, for controlling the clock in response to the difference signal whereby to equalize the period of the clock signal with the period of the control signal; and a voltage pulse width conversion circuit connected to the clock and comprising a counter provided to be paced by the internal clock and to perform a count while the reference control signal is at a given logic level, and a digital/analogue converter connected to the counter for converting a value of count supplied to the converter by the counter into a voltage such as to define the reference voltage of the regulator.

2. The alternator according to claim 1, wherein the difference circuit comprises means for producing a symmetrical rectangular signal with a period which is a whole number multiple of the period of the reference control signal.

3. The alternator according to claim 2, wherein the difference circuit comprises a means for producing difference pulses between the symmetrical rectangular signal and a signal produced from the internal clock.

4. The alternator according to claim 3, wherein the the width of the difference pulses is proportional to the difference between the period of the reference control signal and the period of the signal from the internal clock.

5. The alternator according to claim 3, wherein the difference circuit further includes means for producing a signal representing the direction of the difference signal, at least during the duration of the said difference pulses.

6. The alternator according to claim 5, wherein the control circuit for the internal clock comprises a bidirectional counter connected to the difference circuit for receiving the difference pulses and direction signal, and a digital/analogue converter connected to the counter for receiving the output from the counter.

7. The alternator according to claim 1, wherein the internal clock is a voltage controlled oscillator.

8. The alternator according to claim 1, wherein the digital/analogue converter of the conversion circuit has a memorization input, the alternator further including means for applying to the input a memorization signal so long as the reference control signal is at a logic level other than the given logic level.

9. The alternator according to claim 1, wherein the whole of the conversion circuit is an integrated circuit.

10. The alternator according to claim 9, including a semiconductor chip carrying the regulator circuit, wherein the same chip carries the conversion circuit.

11. An interface device for providing an interface between a control apparatus for supplying a reference control signal in the form of a pulse width modulated signal, and a motor vehicle alternator regulating device defining a reference voltage of the regulating device, the interface device being provided to convert the variations in the width of the pulses of the reference control signal into variations in the reference voltage of the regulating device, the interface device comprising, in combination:

an internal clock with a controllable variable period;

a difference circuit connected to the internal clock for producing a difference signal between the period of the reference control signal and the period of a signal from the internal clock;

a control circuit for the internal clock, connected to the internal clock and the difference circuit, for controlling the internal clock in response to the difference signal, in such a way as to equalize the period of the internal clock signal and the period of the control signal; and a circuit for converting pulse width into voltage, connected to the clock and comprising a counter which is provided to be paced by the controllable internal clock and which is provided to perform a counting operation while the reference control signal is at a given logic level, and a digital/analogue converter which is provided to convert a value of the count supplied to the converter by the counter into a voltage such as to define the reference voltage of the regulator.

12. The alternator according to claim 11, wherein the difference circuit comprises means for producing a symmetrical rectangular signal with a period which is a whole number multiple of the period of the reference control signal.

13. The alternator according to claim 12, wherein the difference circuit comprises a means for producing difference pulses between the said symmetrical rectangular signal and a signal produced from the internal clock.

14. The alternator according to claim 13, wherein the width of the difference pulses is proportional to the difference between the period of the reference control signal and the period of the said signal from the internal clock.

15. The alternator according to claim 13, wherein the difference circuit further includes means for producing a signal representing the direction of the difference signal, at least during the duration of the said difference pulses.

16. The alternator according to claim 15, wherein the control circuit for the internal clock comprises a bidirectional counter connected to the difference circuit for receiving the difference pulses and direction signal, and a digital/analogue converter connected to the counter for receiving the output from the counter.

17. The alternator according to claim 11, wherein the internal clock is a voltage controlled oscillator.

18. The alternator according to claim 11, wherein the digital/analogue converter of the conversion circuit has a memorization input, the alternator further including means for applying to the input a memorization signal so long as the reference control signal is at a logic level other than the given logic level.

19. The alternator according to claim 11, wherein the whole of the conversion circuit is an integrated circuit.

20. The alternator according to claim 19, including a semiconductor chip carrying the regulator circuit, wherein the same chip carries the conversion circuit.

* * * * *